US011609380B2

(12) United States Patent
Yamaguchi et al.

(10) Patent No.: US 11,609,380 B2
(45) Date of Patent: Mar. 21, 2023

(54) LASER DEVICE AND METHOD FOR MANUFACTURING LASER DEVICE

(71) Applicant: Fujikura Ltd., Tokyo (JP)

(72) Inventors: Yutaka Yamaguchi, Sakura (JP); Shinichi Sakamoto, Sakura (JP); Yasuto Chiba, Sakura (JP); Tatsuya Kishi, Sakura (JP)

(73) Assignee: FUJIKURA LTD., Tokyo (JP)

( * ) Notice: Subject to any disclaimer, the term of this patent is extended or adjusted under 35 U.S.C. 154(b) by 62 days.

(21) Appl. No.: 17/423,986

(22) PCT Filed: Mar. 11, 2020

(86) PCT No.: PCT/JP2020/010491
§ 371 (c)(1),
(2) Date: Jul. 19, 2021

(87) PCT Pub. No.: WO2020/184611
PCT Pub. Date: Jan. 7, 2020

(65) Prior Publication Data
US 2022/0091324 A1    Mar. 24, 2022

(30) Foreign Application Priority Data
Mar. 14, 2019  (JP) .............................. JP2019-047411

(51) Int. Cl.
*G02B 6/02* (2006.01)
*G02B 6/14* (2006.01)
(Continued)

(52) U.S. Cl.
CPC ............. *G02B 6/2552* (2013.01); *G02B 6/02* (2013.01); *G02B 6/14* (2013.01); *G02B 6/255* (2013.01);
(Continued)

(58) Field of Classification Search
CPC .... G02B 6/02; G02B 6/0288; G02B 6/03627; G02B 6/14; G02B 6/245; G02B 6/255;
(Continued)

(56) References Cited

U.S. PATENT DOCUMENTS 6,336,749 B1 *  1/2002  O'Toole ............... G02B 6/2551
                                                       385/99
8,942,531 B2 *  1/2015  Donlagic ............. G02B 6/2551
                                                       385/123
(Continued)

FOREIGN PATENT DOCUMENTS

EP         3447553 A1     2/2019
JP       H05288968 A     11/1993
(Continued)

OTHER PUBLICATIONS

International Search Report issued in corresponding International Application No. PCT/JP2020/010491, dated Jun. 9, 2020, with translation (5 pages).

*Primary Examiner* — Ryan A Lepisto
(74) *Attorney, Agent, or Firm* — Osha Bergman Watanabe & Burton LLP

(57) ABSTRACT

A laser device includes: a laser unit that outputs laser light; an output end that launches the laser light; a first fusion splice portion; and a second fusion splice portion. In each of the first fusion splice portion and the second fusion splice portion, two multi-mode fibers are fusion-spliced. Each of the two multi-mode fibers include a core through which the laser light propagates and a cladding that surrounds the core. The first fusion splice portion is disposed closer to the laser unit than is the second fusion splice portion. At least a part of the core in the first fusion splice portion contains a dopant that is the same type as a dopant contained in the cladding in the first fusion splice portion for decreasing a refractive index.

12 Claims, 6 Drawing Sheets

(51) Int. Cl.
  *G02B 6/255* (2006.01)
  *H01S 3/00* (2006.01)
  *H01S 3/23* (2006.01)
  *G02B 6/028* (2006.01)
  *G02B 6/036* (2006.01)
  *G02B 6/245* (2006.01)
  *H01S 5/40* (2006.01)

(52) U.S. Cl.
  CPC ............ *G02B 6/2551* (2013.01); *H01S 3/005* (2013.01); *H01S 3/2383* (2013.01); *G02B 6/0288* (2013.01); *G02B 6/03627* (2013.01); *G02B 6/245* (2013.01); *G02B 6/2553* (2013.01); *H01S 5/4012* (2013.01)

(58) Field of Classification Search
  CPC .. G02B 6/2551; G02B 6/2552; G02B 6/2553; H01S 3/005; H01S 3/2383; H01S 3/4012
  See application file for complete search history.

(56) References Cited

U.S. PATENT DOCUMENTS

| | | | |
|---|---|---|---|
| 10,641,961 B2* | 5/2020 | Ghiringhelli | G02B 6/2551 |
| 10,673,198 B2* | 6/2020 | Kliner | B23K 26/0643 |
| 2004/0114886 A1* | 6/2004 | Christensen | G02B 6/2552 385/96 |
| 2011/0317966 A1* | 12/2011 | Kumkar | G02B 6/2558 385/95 |
| 2018/0214979 A1 | 8/2018 | Koponen et al. | |
| 2018/0224607 A1 | 8/2018 | Bookbinder et al. | |
| 2022/0362878 A1* | 11/2022 | Shima | G02B 6/03688 |

FOREIGN PATENT DOCUMENTS

| | | |
|---|---|---|
| JP | 2001051148 A | 2/2001 |
| JP | 2012510176 A | 4/2012 |
| JP | 2017116465 A | 6/2017 |
| JP | 2017194525 A | 10/2017 |
| WO | 2018042788 A1 | 3/2018 |

* cited by examiner

LASER DEVICE AND METHOD FOR MANUFACTURING LASER DEVICE

CROSS-REFERENCE TO RELATED APPLICATIONS

This application claims priority to Japanese Patent Application No. 2019-047411 filed on Mar. 14, 2019. The entire content of this application is incorporated herein by reference.

TECHNICAL FIELD

The present invention relates to a laser device and a method for manufacturing a laser device.

BACKGROUND

A major characteristic of a laser device is a divergence angle. In general, a Beam Parameter Product (BPP) is used as a parameter for evaluating the divergence angle. Patent Document 1 discloses a laser device including an optical device that adjusts a BPP value using a Gradient-Index (GRIN) lens.

PATENT LITERATURE

Patent Document 1: Japanese Unexamined Patent Application, First Publication No. 2017-194525

In the optical device of Patent Document 1, it is necessary to prepare the GRIN lens and then position two optical fibers and the GRIN lens with relatively high accuracy in order to reduce a loss of light passing through the optical device. Accordingly, there has been a demand for a laser device capable of adjusting the divergence angle with a simpler configuration.

One or more embodiments of the present invention provide a laser device capable of adjusting the divergence angle with a simple configuration.

SUMMARY

According to one or more embodiments of the present invention, there is provided a laser device including: a laser unit that outputs laser light; an output end that launches the laser light; and a first fusion splice portion and a second fusion splice portion having a configuration in which two multi-mode fibers each having a core through which the laser light propagates and a cladding surrounding the core are fusion-spliced to each other, in which when a side closer to the laser unit is an upstream side and a side closer to the output end is a downstream side, the first fusion splice portion is located on an upstream side of the second fusion splice portion, at least a part of the core in the first fusion splice portion contains a dopant that is the same type as a dopant contained in the cladding in the first fusion splice portion for decreasing a refractive index, and the core in the first fusion splice portion and the core in the second fusion splice portion have different refractive index profiles.

According to the embodiments described above, at least a part of the core of the first fusion splice portion contains the dopant that decreases the refractive index, and the refractive index profile in the core is changed by the dopant. More specifically, since a lower refractive index region is provided in the core, the reflection angle of light passing through the region is changed. Therefore, a divergence angle of the entire light passing through the first fusion splice portion is changed. Since an amount of change in the divergence angle depends on the refractive index profile of the core of the first fusion splice portion, the divergence angle of the laser light launched from the output end can be adjusted to a range by adjusting the refractive index profile. Further, it is possible to suppress a variation in the divergence angle between the plurality of laser devices and stabilize quality.

For example, this configuration is simpler than a case where an optical fiber and a lens are connected to adjust the divergence angle, and it is possible to prevent occurrence of loss at the connection portion between the optical fiber and the lens.

Here, the laser device according to one or more embodiments may further include a cladding light stripping unit that removes cladding mode light, and the first fusion splice portion may be located on an upstream side of the cladding light stripping unit.

In this case, even when the cladding mode light is generated due to the fact that the core of the first fusion splice portion contains the dopant that decreases the refractive index, the cladding mode light can be removed by the cladding light stripping unit. Therefore, it is possible to suppress heat generation or the like at an unintended location in the laser device caused by the cladding mode light.

Further, the dopant contained in the cladding of the first fusion splice portion may be fluorine.

In this case, by using the fluorine having a high diffusion rate as the dopant for decreasing the refractive index, it is possible to increase efficiency of moving the dopant from the cladding to the core.

Further, in the core in the first fusion splice portion, a radial dimension of a region containing the dopant may be 10% or greater of a radius of the core.

In this case, a certain proportion of the light propagating in the core passes through the region containing the dopant that decreases the refractive index is secured. Therefore, the divergence angle can be adjusted more reliably. The value of "10% or greater" is not brought about by a normal fusion splicing, but is a value obtained by performing additional heating after performing the fusion splicing, for example.

Further, when a thickness of a part containing the dopant in the cladding in the first fusion splice portion is t and a radius of the core in the first fusion splice portion is r, $t \geq 0.2 \times r$ may be satisfied.

In this case, the total amount of the dopant contained in the cladding can be secured, and the increase in the refractive index of the cladding after the dopant has moved to the core can be suppressed. The "part of the cladding containing the dopant" is a portion in which a difference in refractive index between the portion and the central part of the core is 0.05% or greater.

Further, a diameter of the core in the first fusion splice portion may be 50 μm or greater.

When the diameter of the core is too small, the divergence angle changed by passing through the region containing the dopant that decreases the refractive index returns to an initial angle before the change, after passing through a portion where the region is provided. Therefore, by setting the diameter of the core to 50 μm or greater, it is possible to suppress the return of the divergence angle to the original state, and it is possible to more reliably achieve the effect of adjusting the divergence angle by the region.

Further, the laser device may further include a plurality of laser units that include the laser unit and a combiner that combines laser light output from each of the plurality of laser units into a single fiber, in which the first fusion splice portion may be located between the combiner and the cladding light stripping unit.

In the laser device, the laser unit may be replaced. In this case, the fusion splicing may be performed between the laser unit and the combiner, and if the first fusion splice portion is located at the fusion splice portion, there is a possibility that the refractive index profile of the core of the first fusion splice portion varies. That is, there is a possibility that the divergence angle of the laser light launched from the output end of the laser device varies before and after the laser unit is replaced. Therefore, the first fusion splice portion may be disposed between the combiner and the cladding light stripping unit, where a frequency of component replacement is relatively low. In this case, it is possible to reduce the possibility that the divergence angle varies due to the component replacement.

Further, the second fusion splice portion may be located between the cladding light stripping unit and the output end.

As described above, in the laser device of the embodiments described above, since the divergence angle is mainly changed in the first fusion splice portion, the divergence angle is not changed in the second fusion splice portion, or even when the divergence angle is changed, the amount of change can be smaller than the amount of change in the first fusion splice portion. By disposing the second fusion splice portion between the cladding light stripping unit and the output end, when the second fusion splice portion is fusion-spliced according to the component replacement of the output end, it is possible to suppress a variation in the divergence angle of the laser light launched from the output end before and after the component replacement.

Further, the first fusion splice portion has a configuration in which two multi-mode fibers of the same type may be fusion-spliced to each other, and in the two multi-mode fibers of the same type, outer diameters of the cores may be the same as each other, outer diameter of the claddings may be the same as each other, and the types of the dopants contained in the claddings may be the same as each other.

Further, at least a part of the core in the second fusion splice portion may contain a dopant that is the same type as a dopant contained in the cladding in the second fusion splice portion for decreasing the refractive index.

In this case, the divergence angle can be changed not only in the first fusion splice portion but also in the second fusion splice portion, and a range of adjusting the divergence angle in the entire laser device can be increased. Further, an amount of change in the divergence angle at the first fusion splice portion can be reduced as compared with the case where the divergence angle is changed only at the first fusion splice portion. Accordingly, it is possible to reduce the amount of heat applied to the cladding in order to diffuse the dopant that decreases the refractive index in the first fusion splice portion to the core. Therefore, it is possible to suppress a decrease in transmittance and a decrease in mechanical strength at the first fusion splice portion caused by heating the cladding of the first fusion splice portion.

Further, according to one or more embodiments of the present invention, there is provided a method for manufacturing a laser device including: an adjustment step of launching the laser light from the output end, measuring a divergence angle of the launched laser light, and changing the refractive index profile of the core of the first fusion splice portion so that the divergence angle becomes a predetermined value.

According to the embodiments described above, it is possible to suppress a variation in the divergence angle of each laser device.

Further, the adjustment step may be performed using a fusion splicer that fusion-splices the two multi-mode fibers to each other.

In this case, it is possible to adjust the divergence angle at the time of the fusion splicing which is generally performed when manufacturing the laser device. In this way, by adjusting the divergence angle without adding major changes to the manufacturing step of the related art, it is possible to suppress an increase in manufacturing cost caused by the adjustment of the divergence angle.

According to the above-described embodiments of the present invention, it is possible to provide a laser device capable of adjusting the divergence angle with a simple configuration.

DETAILED DESCRIPTION

Hereinafter, a laser device of one or more embodiments will be described with reference to the drawings.

Figure 1:
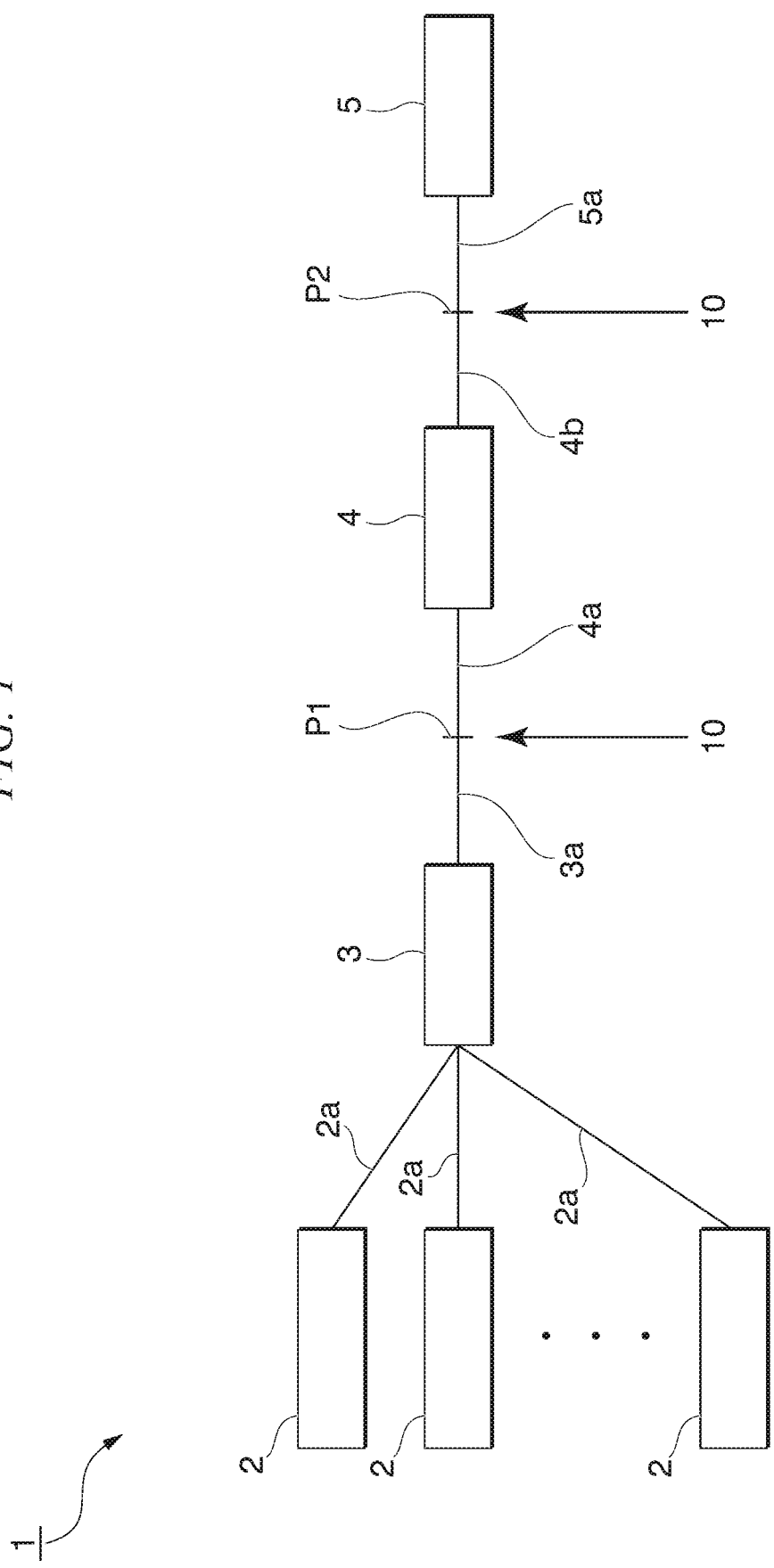
FIG. 1 is a block diagram showing a configuration of a laser device according to one or more embodiments.

As shown in FIG. 1, a laser device 1 includes a plurality of laser units 2, a combiner 3, a cladding light stripping unit 4, and an output end 5. In the present specification, a side closer to the laser unit 2 is referred to as an upstream side, and a side closer to the output end 5 is referred to as a downstream side.

Each laser unit 2 outputs laser light to each fiber 2a. For example, as the laser unit 2, a fiber laser or a semiconductor laser can be used. The laser unit 2 may include an excitation light source that launches excitation light and a resonator that generates laser light by the excitation light. Further, a Master Oscillator Power Amplifier (MOPA) type laser unit 2 may be adopted.

Each fiber 2a is connected to the combiner 3. The combiner 3 combines the laser light output from each laser unit 2 into one fiber 3a. The number of the laser units 2 may be one, and in that case, the combiner 3 may or may not be provided.

The cladding light stripping unit 4 removes excess cladding light propagating in a cladding. A configuration of the cladding light stripping unit 4 can be appropriately selected. For example, in a fusion splice portion between fibers 4a and 4b, a transparent resin (high refractive index resin) having a higher refractive index than the cladding may be provided on an outer periphery of the cladding. In this case, at an interface between the cladding and the high refractive index resin, cladding light easily enters the high refractive index resin side having a higher refractive index. Therefore, the cladding light can be removed from the cladding.

The input-side fiber 4a and the output-side fiber 4b are connected to the cladding light stripping unit 4. The input-side fiber 4a is fusion-spliced to the fiber 3a of the combiner 3 at a first fusion splice portion P1.

The output end 5 is a portion where the laser light is launched. A delivery fiber 5a is connected to the output end 5. The delivery fiber 5a is fusion-spliced to the output-side fiber 4b at a second fusion splice portion P2.

The fiber 3a of the combiner 3, the fibers 4a and 4b of the cladding light stripping unit 4, and the delivery fiber 5a are multi-mode fibers capable of propagating light in multi-mode.

As described above, the laser device 1 of one or more embodiments includes the first fusion splice portion P1 and the second fusion splice portion P2 having a configuration in which two multi-mode fibers are fusion-spliced to each other. The first fusion splice portion P1 is located between the combiner 3 and the cladding light stripping unit 4. The second fusion splice portion P2 is located between the cladding light stripping unit 4 and the output end 5.

In the following description, the two multi-mode fibers fusion-spliced at the fusion splice portions P1 and P2 will be described as a first fiber F1 and a second fiber F2. Regarding the first fusion splice portion P1, the first fiber F1 corresponds to the fiber 3a of the combiner 3, and the second fiber F2 corresponds to the input-side fiber 4a of the cladding light stripping unit 4. Regarding the second fusion splice portion P2, the first fiber F1 corresponds to the output-side fiber 4b of the cladding light stripping unit 4, and the second fiber F2 corresponds to the delivery fiber 5a.

Here, the first fusion splice portion P1 of one or more embodiments constitutes an optical device 10 that changes a divergence angle of light. Hereinafter, a more detailed description will be given with reference to FIG. 2.

Figure 2:
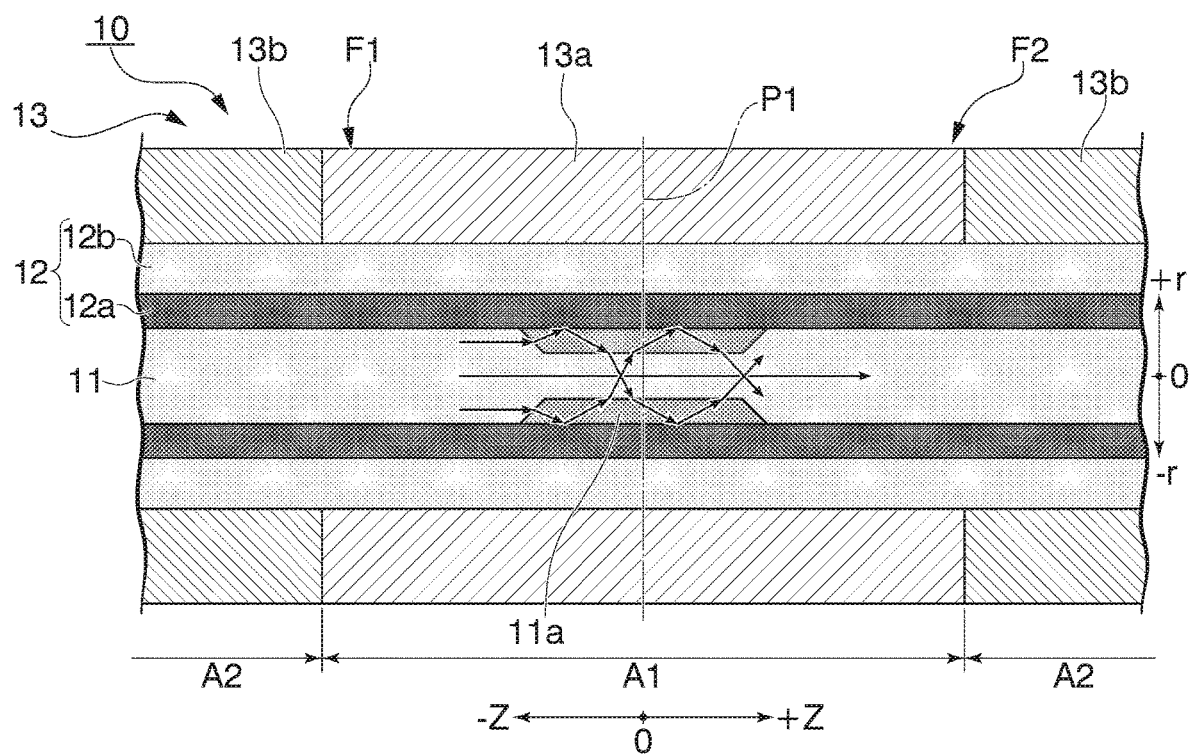
FIG. 2 is a cross-sectional view of an optical device according to one or more embodiments.

FIG. 2 shows a cross section of the optical device 10 when viewed from a direction intersecting a longitudinal direction of the optical device 10. The optical device 10 includes a core 11, a cladding 12, and a coating 13. The fibers F1 and F2 constituting the first fusion splice portion P1 may be of the same type as each other. Further, the fibers F1 and F2 constituting the second fusion splice portion P2 may be of the same type as each other. In the present specification, the term "same type" of two fibers means that outer diameters of the cores 11, outer diameters of the claddings 12, and the types of dopants contained in the cladding 12 are the same as each other.

The core 11 is made of silica glass. For example, the diameter of the core 11 is 50 μm or greater, and light can be propagated in multiple modes. The cladding 12 is made of silica glass and surrounds the core 11. The cladding 12 has an inner portion 12a and an outer portion 12b formed on an outer side of the inner portion 12a. A dopant that decreases a refractive index of silica glass is added to the inner portion 12a. As such a dopant, F (fluorine), B (boron), Ge (germanium) or the like can be adopted. Due to the addition of the dopant, the refractive index of the cladding 12 is decrease than that of the core 11 at least at an interface with the core 11. As a result, the light can be confined in the core 11.

The dopant that decreases the refractive index of silica glass is not added to the outer portion 12b.

As described above, the cladding 12 has the inner portion 12a that contains the dopant which decreases the refractive index and the outer portion 12b that does not contain the dopant. Accordingly, it is possible to reduce the total amount of the dopant added to the cladding 12 and reduce a cost. The dopant that decreases the refractive index may be added to the entire cladding 12. Further, if necessary, a dopant other than the purpose of decreasing the refractive index (for example, for adjusting a viscosity) may be added to the core 11 or the cladding 12.

The coating 13 covers the cladding 12. As the coating 13, a resin or the like can be used. For example, a urethane acrylate-based, a polybutadiene acrylate-based, an epoxy acrylate-based, a silicone acrylate-based, or a polyester acrylate-based UV curable resin may be used as the coating 13.

A part of the coating 13 is a discontinuous portion 13a. In the present specification, the "discontinuous portion" means a portion (coating removing portion) from which the coating 13 is removed or a portion (recoated portion) recoated with resin or the like after the coating 13 has been removed. Further, a part of the coating 13 other than the discontinuous portion 13a is referred to as a continuous portion 13b. In the example of FIG. 2, after a part of the coating 13 is removed, the coating 13 is recoated with a resin or the like to form the discontinuous portion 13a.

In the present specification, a range in which the discontinuous portion 13a is located in the longitudinal direction is referred to as a first region A1, and a range in which the discontinuous portion 13a is not located is referred to as a second region A2. In other words, the second region A2 is a range in which the continuous portion 13b is located.

The fusion splice portion P1 is located in the first region A1. That is, the fusion splice portion P1 is located at a portion where the coating 13 is a discontinuous portion 13a.

Here, in one or more embodiments, an adjusting portion 11a is provided in a part of the core 11 located in the first region A1.

The adjusting portion 11a is a portion where the dopant added to the inner portion 12a of the cladding 12 is diffused or permeated into the core 11. Due to the dopant for decreasing the refractive index, the refractive index of the adjusting portion 11a is decrease than that of the part of the core 11 other than the adjusting portion 11a. The adjusting portion 11a may be a portion where a difference in refractive index between the portion and a central part of the core is 0.05% or greater. The adjusting portion 11a may be provided intermittently along an outer peripheral surface of the core 11, or may be continuously provided over the entire periphery of the outer peripheral surface.

The adjusting portion 11a is disposed so as to straddle the fusion splice portion P1 in the longitudinal direction. In other words, the adjusting portion 11a extends from the fusion splice portion P1 toward both sides in the longitudinal direction. In FIG. 2, with reference to the fusion splice portion P1, one side (downstream side) in the longitudinal direction is referred to as a +Z side, and the other side (upstream side) is referred to as a −Z side. Dimensions in the longitudinal direction from the fusion splice portion P1 to an end part of the adjusting portion 11a on the +Z side are substantially the same as dimensions in the longitudinal direction from the fusion splice portion P1 to an end part of the adjusting portion 11a on the −Z side. That is, the adjusting portion 11a is formed substantially symmetrically with the fusion splice portion P1 as the center.

The adjusting portion 11a can be provided by heating the cladding 12 and moving the dopant contained in the inner portion 12a of the cladding 12 for decreasing the refractive index to the core 11. As a specific method of providing the adjusting portion 11a, for example, a part of the coating 13 may be removed to expose an outer peripheral surface of the cladding 12, and the exposed cladding 12 may be heated by a heater. Alternatively, the exposed cladding 12 may be discharged by electric power and heated by the discharge. In particular, arc discharge by a fusion splicer 100 as shown in FIG. 3 may be used.

Figure 3:
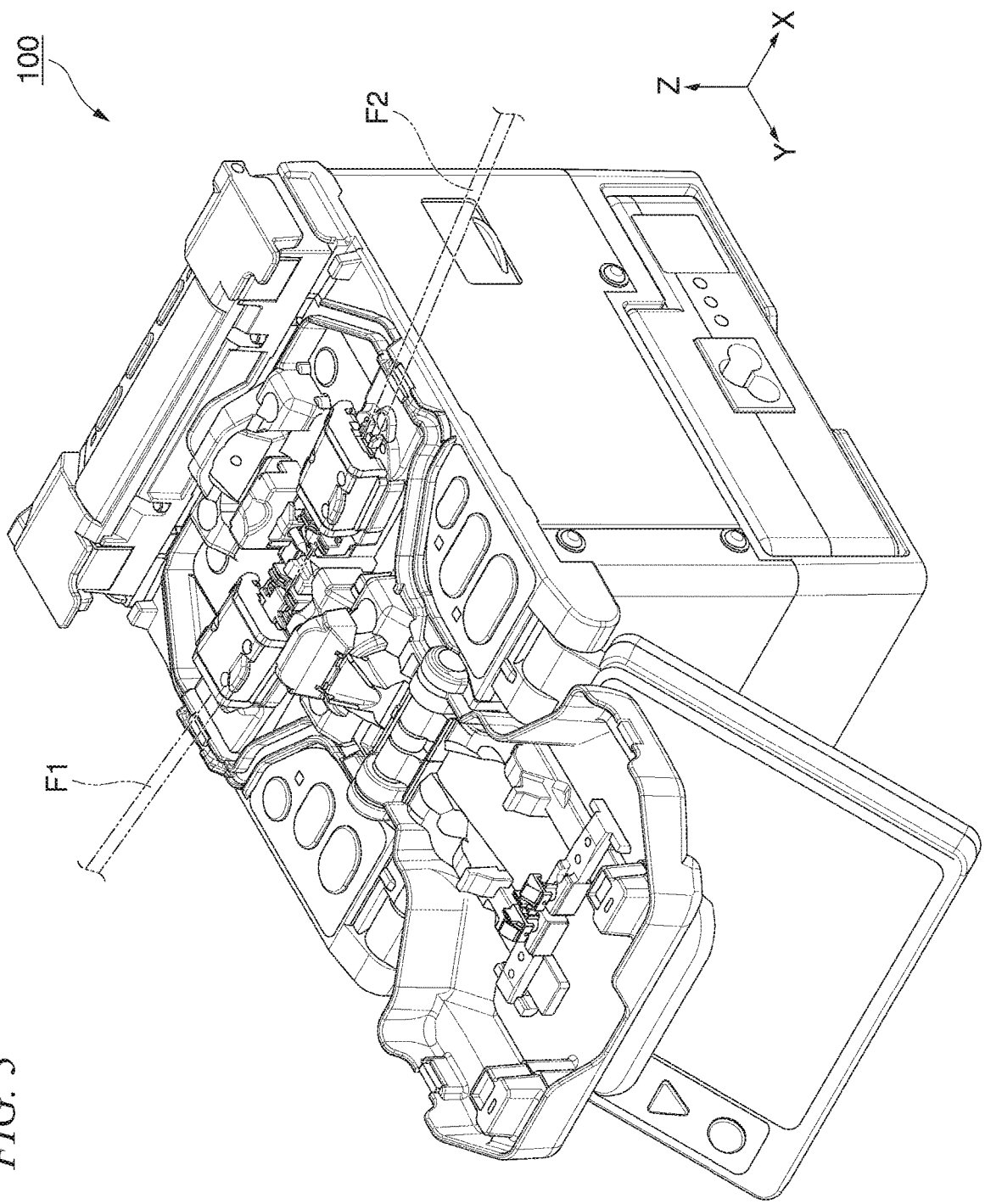
FIG. 3 is a view showing an example of a fusion splicer.

FIG. 3 shows an example of the fusion splicer 100. The fusion splicer 100 holds and positions the fibers F1 and F2 so that an axis of the first fiber F1 and an axis of the second fiber F2 coincide with each other and end faces of the fibers F1 and F2 are in contact with each other. Then, the core 11 and the cladding 12 of the fibers F1 and F2 are melted and fused by performing discharge in the vicinity of the contacted end faces to heat the contacted end faces. The fusion splice portion P1 can be provided by using the fusion splicer 100. Further, by fusion-splicing the fibers F1 and F2 and then performing additional discharge, the dopant contained in the cladding 12 for decreasing the refractive index can be moved to the core 11 to provide the adjusting portion 11a.

Considering a diffusion speed in the silica glass, F (fluorine) may be used as the dopant for decreasing the refractive index. By using F, the dopant can be moved from the cladding 12 to the core 11 in a shorter time as compared with B or Ge, for example, and the adjusting portion 11a can be provided.

After the adjusting portion 11a is provided, the portion from which the coating 13 has been removed may be recoated with a resin. In this case, the outer peripheral surface of the cladding 12 can be protected by the re-covered coating (recoated portion). However, for example, when a possibility of heat generation due to leaked light is low, the recoated portion may not be provided.

A refractive index profile of the core 11 in the portion where the adjusting portion 11a is provided is different from a refractive index profile of the core 11 in the portion where the adjusting portion 11a is not provided.

The "refractive index profile" is a refractive index distribution of the core 11 in a radial direction.

Next, an operation of the laser device 1 configured as described above will be described.

In the second region A2 shown in FIG. 2, the refractive index profile of the core 11 is constant along the longitudinal direction. Therefore, the divergence angle of the light traveling in the second region A2 becomes constant along the longitudinal direction.

On the other hand, in at least a part of the first region A1, the refractive index profile of the core 11 is changed by the adjusting portion 11a. That is, the light that has entered the first region A1 from the second region A2 propagates in the region where the refractive index profile changes in the longitudinal direction. Further, the adjusting portion 11a is provided not as a whole in the radial direction of the core 11, but as a part of the outer periphery. Therefore, a part of the light propagating in the core 11 is affected by the adjusting portion 11a, while the remaining portion thereof is not affected by the adjusting portion 11a. As a result, a reflection angle of a part of the light propagating in the core 11 varies, and the divergence angle of the light passing through the fusion splice portion P1 is changed. In a single-mode fiber, there is no effect because the propagating mode is single, but in a case of a multi-mode fiber, it is considered that the divergence angle is changed because coupling efficiency between modes is changed.

Further, as a degree of change in the refractive index profile increases when comparing the first region A1 and the second region A2, a degree of change in the divergence angle of light also increases. Moreover, the degree of change in the refractive index profile depends on a heating time or a heating temperature when the adjusting portion 11a is provided by heating. That is, by adjusting the heating time and the heating temperature, it is possible to change the divergence angle of the light, and thus, for example, a Beam Parameter Product (BPP) can be set to a value.

As described above, at least a part of the core 11 of the first fusion splice portion P1 contains a dopant that is the same type as the dopant contained in the cladding 12 for decreasing the refractive index. Meanwhile, the core 11 of the second fusion splice portion P2 does not contain the dopant having the refractive index change, or even when the dopant is contained, a content thereof is smaller than a content in the first fusion splice portion P1. Therefore, the core 11 of the first fusion splice portion P1 and the core 11 of the second fusion splice portion P2 have different refractive index profiles. When the core 11 of the second fusion splice portion P2 also contains a dopant that decreases the refractive index, a radial thickness of the contained region may be 5% or less of the radius of the core 11.

An amount of the dopant diffused from the cladding 12 to the core 11 depends on the amount of heat applied to the cladding 12. Accordingly, by setting the heating time or heating temperature at the first fusion splice portion P1 to be larger than the heating time or heating at the second fusion splice portion P2, the refractive index profiles can be different as described above.

As described above, the laser device 1 of one or more embodiments includes the first fusion splice portion P1 and the second fusion splice portion P2 having the configuration in which the two fibers F1 and F2 each having the core 11 through which the laser light propagates and the cladding 12 surrounding the core 11 are fusion-spliced to each other. Then, at least a part of the core 11 of the first fusion splice portion P1 contains the dopant that decreases the refractive index, and the refractive index profile in the core 11 is changed by the dopant. Therefore, the divergence angle of the laser light launched from the output end 5 can be adjusted to a range. Further, it is possible to suppress a variation in the divergence angle between the plurality of laser devices and stabilize quality.

For example, this configuration is simpler than a case where an optical fiber and a lens are connected to adjust the divergence angle, and it is possible to prevent occurrence of loss at the connection portion between the optical fiber and the lens.

Further, the first fusion splice portion P1 is located on the upstream side of the cladding light stripping unit 4. With this configuration, even when the cladding mode light is generated at the first fusion splice portion P1, the cladding mode light can be removed by the cladding light stripping unit 4. Therefore, it is possible to suppress heat generation or the like at an unintended location in the laser device 1 caused by the cladding mode light.

Further, in the laser device 1, the laser unit 2 may be replaced. In this case, a fusion splicing may be performed between the laser unit 2 and the combiner 3, and if the first fusion splice portion P1 is located at the fusion splice portion, there is a possibility that the refractive index profile of the core of the first fusion splice portion P1 varies before and after the laser unit 2 is replaced. That is, there is a possibility that the divergence angle of the laser light launched from the output end 5 varies before and after the laser unit 2 is replaced. Therefore, by disposing the first fusion splice portion P1 in the portion having a low frequency of component replacement between the combiner 3 and the cladding light stripping unit 4, it is possible to reduce the possibility that the divergence angle varies due to the component replacement.

Further, also in the second fusion splice portion P2, the dopant of the same type as the dopant contained in the cladding 12 that decreases the refractive index may be contained in the core 11. That is, the adjusting portion 11a may also be provided in the core 11 of the second fusion splice portion P2. In this way, by changing the divergence angle also in the second fusion splice portion P2, it is possible to increase an adjustable range of the divergence angle in the entire laser device 1. Further, an amount of change in the divergence angle at the first fusion splice portion P1 can be reduced as compared with the case where the divergence angle is changed only by the first fusion splice portion P1. Accordingly, it is possible to reduce the amount of heat applied to the cladding 12 in order to diffuse the dopant that decreases the refractive index in the first fusion splice portion P1 to the core 11. Therefore, it is possible to suppress a decrease in transmittance and a decrease in mechanical strength at the first fusion splice portion P1 caused by heating the cladding 12 of the first fusion splice portion P1.

However, the amount of change in the divergence angle in the second fusion splice portion P2 may be smaller than the amount of change in the divergence angle in the first fusion splice portion P1. In this way, when the amount of change in the divergence angle at the second fusion splice portion P2 is reduced, the cladding mode light is less likely to be generated at the second fusion splice portion P2. Therefore, even when the second fusion splice portion P2 is located on the downstream side of the cladding light stripping unit 4, it is possible to prevent the cladding mode light from being included in the laser light launched from the output end 5.

Further, in the laser device 1, the output end 5 may be replaced. In this case, after the output end is replaced, the fusion splicing performed again in the second fusion splice portion P2 located between the cladding light stripping unit 4 and the output end 5. In consideration of this, by lowering ability to change the divergence angle at the second fusion splice portion P2, it is possible to prevent the divergence angle of the laser light launched from the output end 5 from being significantly changed before and after the output end is replaced.

Further, by adopting fluorine having a high diffusion rate as the dopant contained in the cladding 12 of the fusion splice portion P1 for decreasing the refractive index, the dopant can be efficiently diffused into the core 11 in a shorter time.

Further, in the core 11 of the first fusion splice portion P1, the radial dimension of the region (adjusting portion 11a) containing the dopant that decreases the refractive index may be 10% or greater of the radius of the core 11. For example, when the radius of the core 11 is 50 μm, the radial dimension of the adjusting portion 11a may be 5 μm or greater. With the ratio, about 19% or greater of the light propagating through the core 11 is affected by the adjusting portion 11a. In this way, by securing a certain proportion of the light propagating in the core 11 that is affected by the adjusting portion 11a, it is possible to more reliably adjust the divergence angle by the adjusting portion 11a. In order to set the radial dimension of the adjusting portion 11a to 10% or greater of the radius of the core 11, for example, additional heating may be performed after performing a normal fusion splicing.

Further, in one or more embodiments, the adjusting portion 11a is provided by moving the dopant contained in the cladding 12 for decreasing the refractive index to the core 11. Therefore, the refractive index of the cladding 12 increases by an amount of movement of the dopant. Accordingly, when the thickness of the portion (that is, the inner portion 12a) of the cladding 12 containing the dopant that decreases the refractive index is referred to as t and the radius of the core 11 is referred to as r, t≥0.2× r may be satisfied. In this way, by making the inner portion 12a thick to some extent, the total amount of the dopant contained in the cladding 12 can be secured, and the increase in the refractive index of the cladding 12 after the dopant has moved to the core 11 can be suppressed.

Further, for example, when the diameter of the core 11 is too small as in single-mode fiber, it is conceivable that the divergence angle adjusted by the adjusting portion 11a returns to the size before the adjustment after passing through the portion where the adjusting portion 11a is provided. Therefore, by setting the diameter of the core 11 to 50 μm or greater, the divergence angle is maintained even after passing through the portion where the adjusting portion 11a is provided, and an effect of adjusting the divergence angle in the fusion splice portion P1 can be more reliably achieved.

Further, in one or more embodiments, the refractive index profile of the core 11 is changed by moving a part of the dopant that is initially located in the cladding 12 for decreasing the refractive index to the core 11. Therefore, when the amount of the dopant transferred to the core 11 is excessive, the refractive index of the cladding 12 may increase, and the light confinement of the core 11 by the cladding 12 may be weakened. In consideration of this, a difference between a minimum refractive index of the cladding 12 in the second region A2 and a minimum refractive index of the cladding 12 in the first region A1 may be 10% or less.

Further, a manufacturing method of the laser device 1 of one or more embodiments includes an adjustment step of launching the laser light from the output end 5, measuring the divergence angle of the launched laser light, and changing the refractive index profile of the core 11 of the first fusion splice portion P1 so that the divergence angle becomes a predetermined value. As a result, it is possible to suppress a variation in the divergence angle of each laser device.

Further, by performing the adjustment step using the fusion splicer 100, it is possible to adjust the divergence angle at the time of the fusion splicing which is generally performed when manufacturing the laser device 1. In this way, by adjusting the divergence angle without adding major changes to the manufacturing step of the related art, it is possible to suppress an increase in manufacturing cost caused by the adjustment of the divergence angle.

EXAMPLES

Hereinafter, one or more embodiments will be described with reference to specific examples. The present invention is not limited to the following examples. In particular, the structures of the fusion splice portions P1 and P2 are not limited to the refractive index distribution shown in FIGS. 4A to 6B used in the following description.

In the present example, the following three optical devices (Samples 1 to 3) were prepared.
  Sample 1: No additional discharge (FIG. 4A, FIG. 4B)
  Sample 2: With additional discharge (FIG. 5A, FIG. 5B)
  Sample 3: With additional discharge (FIG. 6A, FIG. 6B)
  Each of Samples 1 to 3 is an optical device configured by fusion-splicing two multi-mode fibers F1 and F2 (refer to FIG. 2). The fusion splicing was performed using the fusion splicer 100 shown in FIG. 3. The diameter of the core 11 was 100 µm, and the diameter of the cladding 12 was 360 µm. The cladding 12 had the inner portion 12a to which fluorine was added and the outer portion 12b to which fluorine was not added. The thickness of the inner portion 12a was set to about 25 µm.

For Samples 2 and 3, after the multi-mode fibers F1 and F2 were fusion-spliced, additional discharge was performed on the fusion splice portion P1 to move the fluorine contained in the cladding 12 to the core 11, and the adjusting portion 11a was provided. However, an intensity of the additional discharge of Sample 3 was set to be twice an intensity of the additional discharge of Sample 2. That is, the intensities of the additional discharges were different in Samples 2 and 3. For Samples 2 and 3, the discharge time was set to 20 seconds. No additional discharge was performed on Sample 1.

Figure 4A:
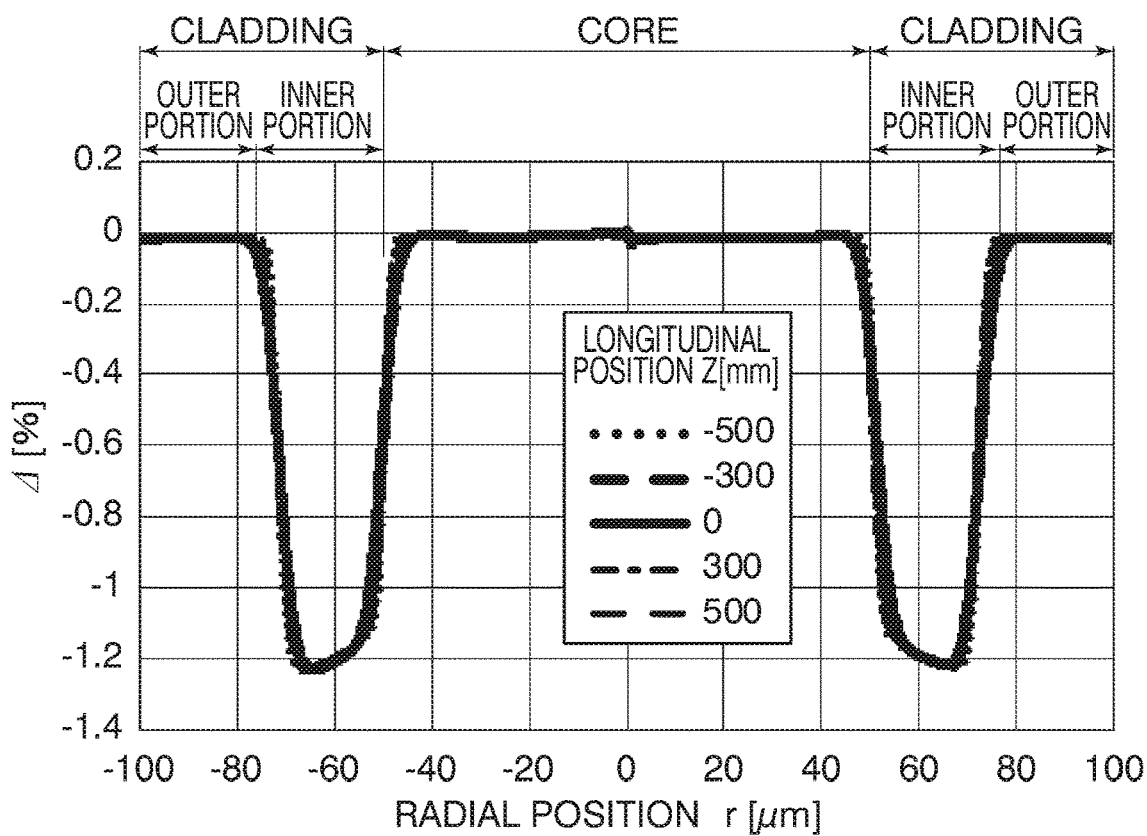
FIG. 4A is a graph showing a refractive index profile of Sample 1.
Figure 5A:
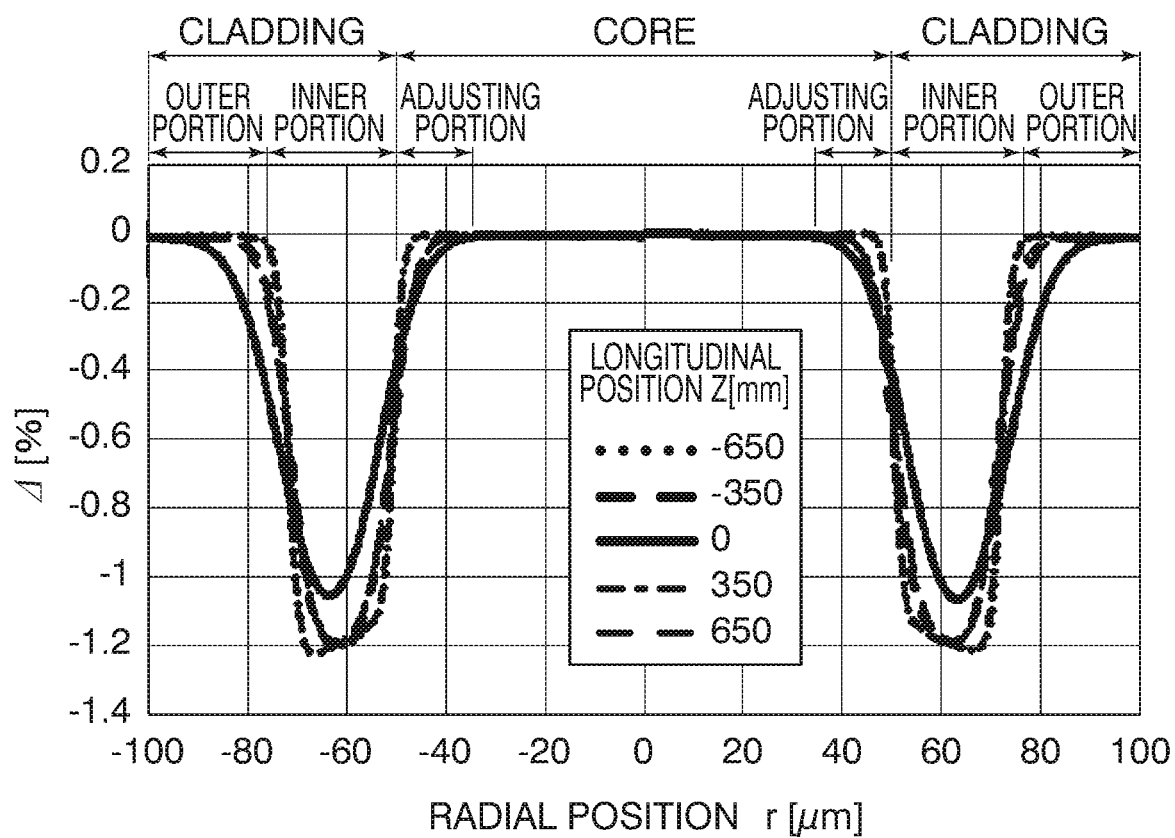
FIG. 5A is a graph showing a refractive index profile of Sample 2.
Figure 6A:
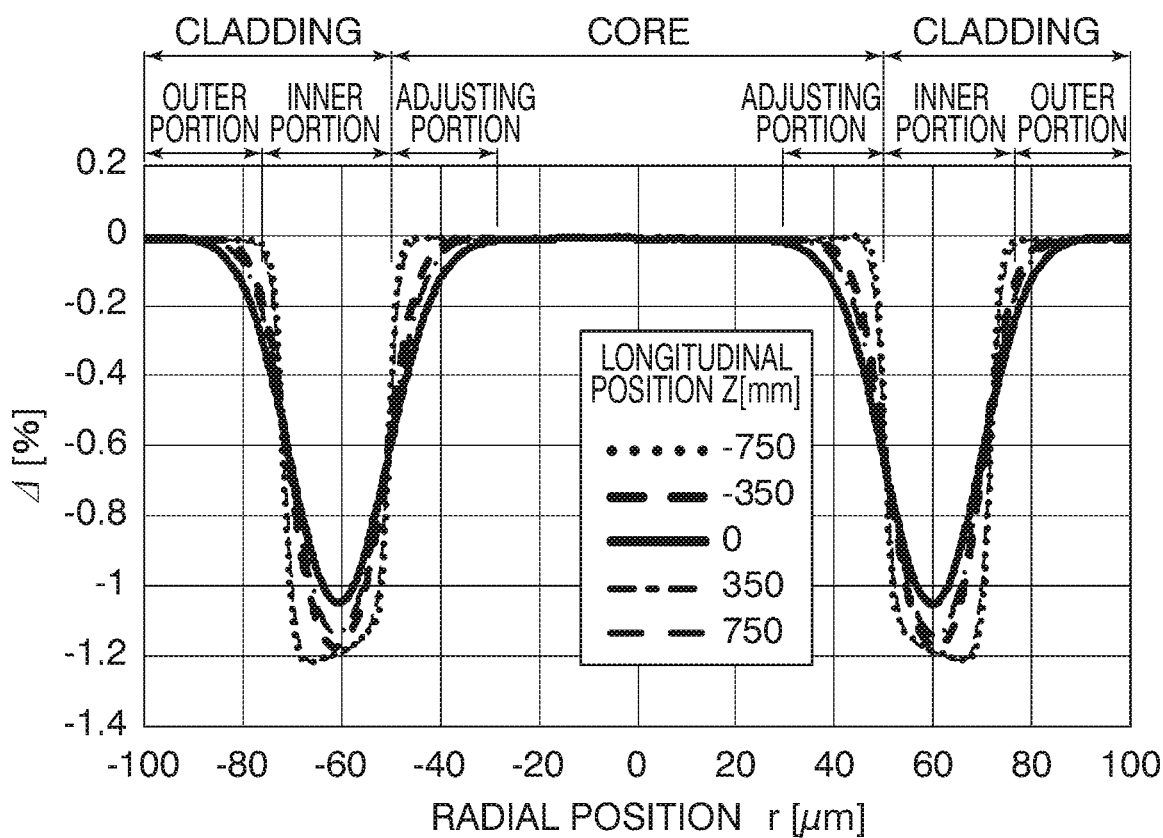
FIG. 6A is a graph showing a refractive index profile of Sample 3.

Horizontal axes of FIGS. 4A, 5A, and 6A indicate radial positions of the multi-mode fibers F1 and F2, and a center position of the core 11 is r=0. Since the diameter of the core 11 is 100 µm, a range of $-50\ \mu m \le r \le 50\ \mu m$ on the horizontal axis indicates the refractive index profile of the core 11. Further, a range of $-75 \le r < -50$ µm and a range of $50\ \mu m < r \le 75$ µm on the horizontal axis indicate a refractive index profile of a fluoridated region (inner portion 12a) of the cladding 12.

A vertical axis of FIGS. 4A, 5A, and 6A indicates a relative refractive index difference Δ based on the refractive index of the outer peripheral surface of the cladding 12 in Sample 1. In other words, the relative refractive index difference Δ is the relative refractive index difference based on the silica glass to which fluorine is not added. FIGS. 4A, 5A, and 6A show five data having different longitudinal positions (Z-axis coordinates). As shown in FIG. 2, the position of the fusion splice portion P1 is Z=0. Further, when viewed from the fusion splice portion P1, a right side of a paper surface in FIG. 2 is the +Z side, and a left side of the paper surface is the −Z side. The definition of the Z axis is common to FIGS. 4A, 5A, and 6A.

Figure 4B:
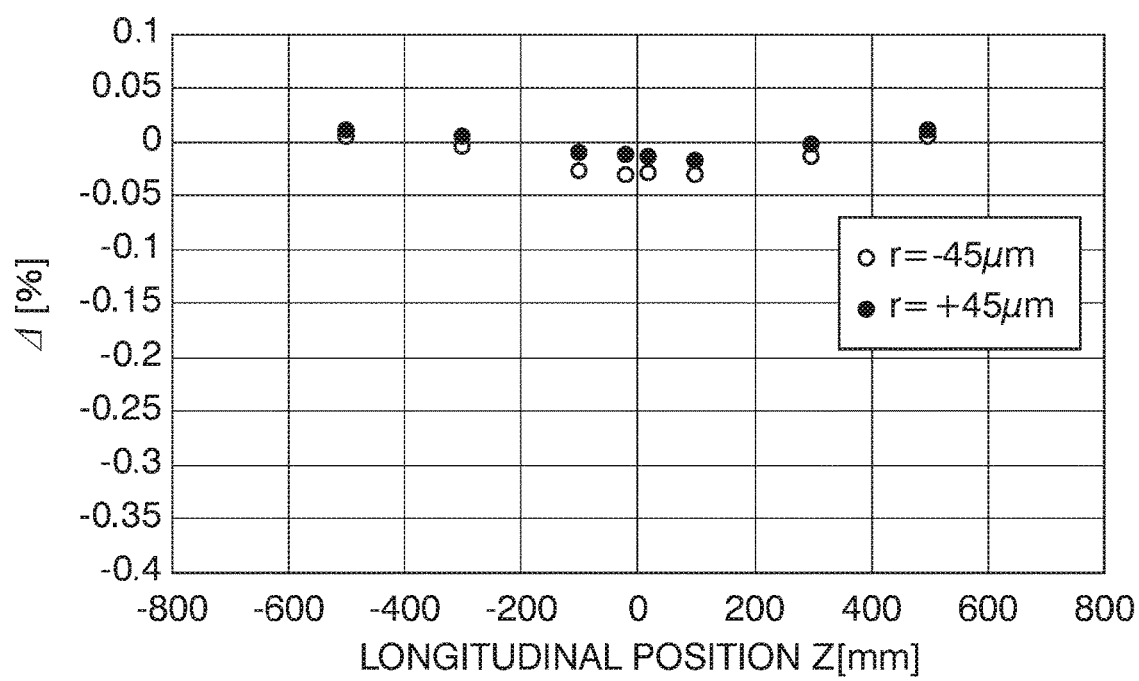
FIG. 4B is a graph showing a refractive index distribution of Sample 1 in a longitudinal direction.
Figure 5B:
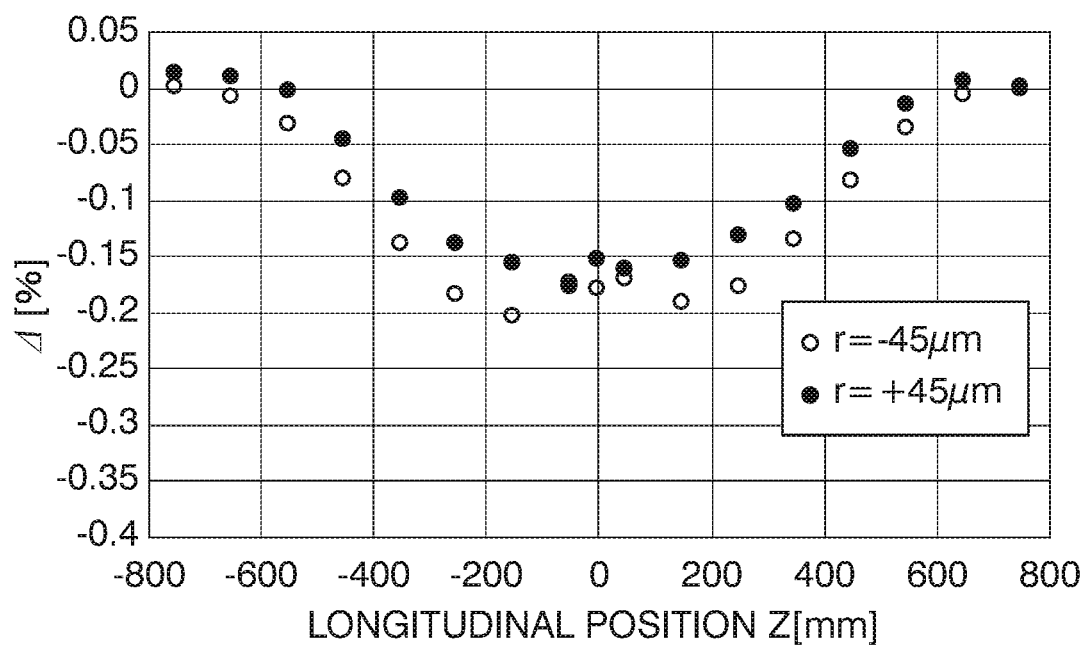
FIG. 5B is a graph showing a refractive index distribution of Sample 2 in the longitudinal direction.
Figure 6B:
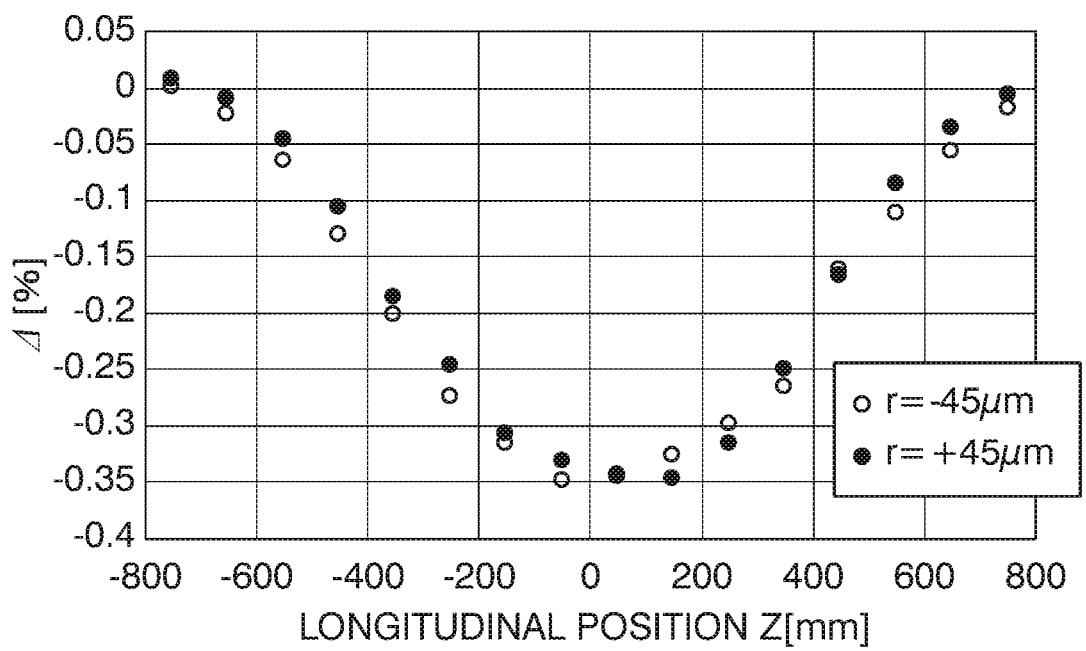
FIG. 6B is a graph showing a refractive index distribution of Sample 3 in the longitudinal direction.

Horizontal axes of FIGS. 4B, 5B, and 6B indicate longitudinal positions. The definition of the Z axis is the same as in FIGS. 4A, 5A, and 6A. Vertical axes of FIGS. 4B, 5B, and 6B are the same as those of FIGS. 4A, 5A, and 6A.

FIGS. 4B, 5B, and 6B show the relative refractive index difference Δ at two different radial positions (r=±45 µm).

First, FIGS. 4A, 5A, and 6A are considered. As shown in FIG. 4A, in Sample 1 in which the additional discharge is not performed, the refractive index profile is substantially constant regardless of the longitudinal position. Meanwhile, as shown in FIGS. 5A and 6A, the refractive index profiles of Samples 2 and 3 subjected to the additional discharge are significantly different depending on the longitudinal position. More specifically, as the longitudinal position approaches the fusion splice portion P1, that is, as the Z-axis coordinate approaches 0, Δ in the adjusting portion 11a decreases and Δ in the inner portion 12a of the cladding 12 increases. This means that the fluorine added to the inner portion 12a moves to the adjusting portion 11a, and thus, the refractive index of the adjusting portion 11a decreases and the refractive index of the inner portion 12a increases. Moreover, the amount of movement of the fluorine increases as it approaches the fusion splice portion P1 which is a center position of the additional discharge. This is because the closer to the center position of the additional discharge, the stronger the heating, and the diffusion movement of fluorine due to the heat becomes active.

In this way, it was confirmed that the refractive index profile of the core 11 could be changed by moving the fluorine in the cladding 12 by performing additional discharge after the fibers F1 and F2 were fusion-spliced in the fusion splicer 100.

Further, from the refractive index profiles of FIGS. 5A and 6A, it can be seen that in Samples 2 and 3, the radial position of the adjusting portion 11a is approximately in ranges of $-50\ \mu m \le r \le -35$ µm and $35 \le r \le 50$ µm. That is, the radial dimension of the adjusting portion 11a is about 15 µm. Since the radius of the core 11 is 50 µm, the radial dimension of the adjusting portion 11a in Samples 2 and 3 is about 30% of the radius of the core 11.

Further, as shown in FIGS. 5B and 6B, the relative refractive index difference Δ in the vicinity of Z=0 is significantly different between Sample 2 and Sample 3. That is, the refractive index in the vicinity of the fusion splice portion P1 at r=±45 µm (within the range of the adjusting portion 11a) is significantly different between Sample 2 and Sample 3. More specifically, the relative refractive index difference Δ at r=±45 µm and Z=0 is about −0.18% in Sample 2 and about −0.35% in Sample 3.

Then, when the optical devices of Samples 1 to 3 were provided in the laser device, the BPP value of the light propagating in the laser device changed. More specifically, an amount of change in the BPP between Sample 3 and Sample 1 was about twice an amount of change in the BPP between Sample 2 and Sample 1. This is almost the same as the difference in the relative refractive index difference Δ at r=±45 µm and Z=0 described above. Since the difference between Sample 3 and Sample 2 is the difference in the intensity of the additional discharge, it was confirmed that the amount of change in the BPP could be adjusted by adjusting the intensity of the additional discharge.

Further, as shown in FIGS. 5B and 6B, in Samples 2 and 3, the refractive index is gradually changed along the longitudinal direction. Here, in a case where the refractive index is changed in the longitudinal direction in the core 11, when the change is steep with respect to the longitudinal direction, reflection occurs in the core 11 so that the light reverses in the longitudinal direction. Meanwhile, as shown in FIGS. 5B and 6B, when the refractive index is changed gently in the longitudinal direction, the reflection in the core 11 is unlikely to occur.

Further, as shown in FIGS. 4A, 5A, and 6A, in Samples 1 to 3, the minimum difference in refractive index in the cladding 12 was Δ=0%, which was substantially unchanged.

As a result, it is possible to prevent the cladding 12 from weakening the effect of confining light into the core 11.

Further, with respect to the radius r (50 µm) of the core 11, the thickness t of the inner portion 12a to which the fluorine of the cladding 12 is added is about 25 µm, which is a sufficient thickness. As a result, the total amount of the dopant contained in the cladding 12 can be secured, and the increase in the refractive index of the cladding 12 after the dopant has moved to the core 11 can be suppressed.

A technical scope of the present invention is not limited to the above-described embodiments, and various modifications can be made without departing from a spirit of the present invention.

For example, in one or more embodiments, the fusion splice portion P1 is heated by the additional discharge of the fusion splicer 100, and the dopant that decreases the refractive index of the cladding 12 is diffused in the core 11. However, for example, the dopant may be diffused into the core 11 by heating the fusion splice portion P1 using a heater or the like.

Further, the positions of the fusion splice portions P1 and P2 are not limited to FIG. 1 and can be changed appropriately.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

1: Laser device
2: Laser unit
5: Output end
11: Core
12: Cladding
13: Coating
P1: First fusion splice portion
P2: Second fusion splice portion
F1, F2: Multi-mode fiber

What is claimed is:

1. A laser device comprising:
a laser unit that outputs laser light;
an output end that launches the laser light;
a first fusion splice portion; and
a second fusion splice portion, wherein
in each of the first fusion splice portion and the second fusion splice portion, two multi-mode fibers are fusion-spliced, wherein each of the two multi-mode fibers comprise a core through which the laser light propagates and a cladding that surrounds the core,
the first fusion splice portion is disposed closer to the laser unit than is the second fusion splice portion,
at least a part of the core in the first fusion splice portion contains a dopant that is the same type as a dopant contained in the cladding in the first fusion splice portion for decreasing a refractive index, and
the core in the first fusion splice portion and the core in the second fusion splice portion have different refractive index profiles.

2. The laser device according to claim 1, further comprising:
a cladding light stripping unit that removes cladding mode light, wherein
the first fusion splice portion is disposed closer to the laser unit than is the cladding light stripping unit.

3. The laser device according to claim 1, wherein the dopant contained in the cladding of the first fusion splice portion is fluorine.

4. The laser device according to claim 1, wherein in the core in the first fusion splice portion, a radial dimension of a region containing the dopant is 10% or greater of a radius of the core.

5. The laser device according to claim 1, wherein $t \geq 0.2 \times r$, where t is a thickness of a part containing the dopant in the cladding in the first fusion splice portion and r is a radius of the core in the first fusion splice portion.

6. The laser device according to claim 1, wherein a diameter of the core in the first fusion splice portion is 50 μm or greater.

7. The laser device according to claim 1, further comprising:
a plurality of laser units that include the laser unit;
a combiner that combines laser light output from each of the plurality of laser units into a single fiber; and
a cladding light stripping unit that removes cladding mode light, wherein
the first fusion splice portion is disposed between the combiner and the cladding light stripping unit.

8. The laser device according to claim 1, further comprising:
a cladding light stripping unit that removes cladding mode light, wherein
the second fusion splice portion is disposed between the cladding light stripping unit and the output end.

9. The laser device according to claim 1, wherein
the two multi-mode fibers in the first fusion splice portion have the same outer diameter of the cores, the same outer diameter of the cladding, and the same type of the dopant contained in the cladding.

10. The laser device according to claim 1, wherein at least a part of the core in the second fusion splice portion contains a dopant that is the same type as a dopant contained in the cladding in the second fusion splice portion for decreasing the refractive index.

11. A method for manufacturing a laser device, which manufactures the laser device according to claim 1, the method comprising:
an adjustment step of launching the laser light from the output end, measuring a divergence angle of the launched laser light, and changing the refractive index profile of the core of the first fusion splice portion such that the divergence angle becomes a predetermined value.

12. The method for manufacturing a laser device according to claim 11, wherein the adjustment step is performed using a fusion splicer that fusion-splices the two multi-mode fibers to each other.

* * * * *